(12) United States Patent
Chang et al.

(10) Patent No.: US 11,895,799 B2
(45) Date of Patent: Feb. 6, 2024

(54) ADJUSTABLE SUPPORT FRAME FOR INTERIOR OF CABINET AND CABINET INCLUDING SUPPORT FRAME

(71) Applicant: Fulian Precision Electronics (Tianjin) Co., LTD., Tianjin (CN)

(72) Inventors: Chih-Feng Chang, Tu-Cheng (TW); Hung-Liang Chung, New Taipei (TW); Ti-An Tsai, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 0 days.

(21) Appl. No.: 17/705,961

(22) Filed: Mar. 28, 2022

(65) Prior Publication Data

US 2022/0338366 A1    Oct. 20, 2022

(30) Foreign Application Priority Data

Apr. 19, 2021    (CN) .......................... 202110418121.8

(51) Int. Cl.
*H05K 7/14*   (2006.01)
*H05K 7/18*   (2006.01)
*F16B 2/04*   (2006.01)
*F16B 7/04*   (2006.01)

(52) U.S. Cl.
CPC ............. *H05K 7/1489* (2013.01); *F16B 2/04* (2013.01); *F16B 7/0473* (2013.01); *F16B 7/0493* (2013.01); *H05K 7/183* (2013.01)

(58) Field of Classification Search
CPC .... H05K 7/1489; H05K 7/1488; H05K 7/183; F16B 2/04; F16B 7/0473; F16B 7/0493
See application file for complete search history.

(56) References Cited

U.S. PATENT DOCUMENTS

| | | | |
|---|---|---|---|
| 8,281,940 B2 * | 10/2012 | Fan ..................... | H05K 7/1488 312/265.4 |
| 8,727,138 B2 * | 5/2014 | Dittus .................. | H05K 7/183 312/334.4 |
| 9,814,156 B2 * | 11/2017 | Wilson ................ | H05K 7/183 |
| 10,524,381 B1 * | 12/2019 | Corbo ................. | A47B 88/43 |
| 11,102,905 B2 * | 8/2021 | Lu ....................... | H05K 7/1488 |

(Continued)

FOREIGN PATENT DOCUMENTS

CN    112689432 A  *  4/2021
WO    WO-2018068286 A1  *  4/2018

*Primary Examiner* — Kimberley S Wright
(74) *Attorney, Agent, or Firm* — ScienBiziP, P.C.

(57) ABSTRACT

A support frame includes first and second mounting members, and an adjusting member. The second mounting member defines a groove. One groove wall of the groove defines a plurality of positioning holes. The adjusting member includes a base body, a sliding member, and an elastic member. The base body is disposed on the first mounting member, and at least a part of the base body is accommodated in the groove. The sliding member is slidably disposed on the base body and includes a clamping body. The elastic member is disposed on the sliding member, and the elastic member can drive the sliding member to engage the clamping body with one of the plurality of positioning holes. When the support frame is in a cabinet, an interior installation size of the cabinet is adjustable for any particular relative position between the first and second mounting members.

15 Claims, 4 Drawing Sheets

(56) References Cited

U.S. PATENT DOCUMENTS

| | | | |
|---|---|---|---|
| 2012/0007478 A1* | 1/2012 | Fan | H05K 7/1488 312/223.2 |
| 2013/0112638 A1* | 5/2013 | Dittus | H05K 7/183 211/123 |
| 2017/0094827 A1* | 3/2017 | Wilson | F16B 2/24 |
| 2020/0077533 A1* | 3/2020 | Lu | H05K 7/1488 |

* cited by examiner

ADJUSTABLE SUPPORT FRAME FOR INTERIOR OF CABINET AND CABINET INCLUDING SUPPORT FRAME

FIELD

The subject matter herein generally relates to server supports, in particular to a support frame capable of adjusting a support size and a cabinet including the support frame.

BACKGROUND

A support frame is generally designed to match one article only, to be installed, of a specific specification. However, such support frame does not match articles of different sizes, such as servers with different depths.

BRIEF DESCRIPTION OF THE DRAWINGS

Implementations of the present technology will now be described, by way of embodiment, with reference to the attached figures.

DETAILED DESCRIPTION

The technical solutions in the embodiments of the present disclosure are clearly and completely described in the following with reference to the accompanying drawings in the embodiments of the present disclosure. The described embodiments are only some of the embodiments of the present disclosure, and not all of the embodiments. All other embodiments obtained by those skilled in the art based on the embodiments of the present disclosure without creative efforts are within the scope of the present disclosure.

Unless otherwise defined, all technical and scientific terms used herein have the same meaning as those understood in the art. The terminology used in the description of the present disclosure is for the purpose of describing particular embodiments and is not intended to limit the disclosure.

Embodiments of the present disclosure provide a support frame. The support frame includes a first mounting member, a second mounting member, and an adjusting member. The first mounting member extends along a first direction. The second mounting member extends along a second direction intersecting with the first direction. The adjusting member is disposed on the first mounting member. The second mounting member defines a groove extending along the second direction. A groove wall of the groove defines a plurality of positioning holes. The adjusting member includes a base body, a sliding member, and an elastic member. The base body is disposed on the first mounting member. At least a part of the base body is accommodated in the groove. The sliding member is slidably disposed on the base body. A clamping body is disposed on the sliding member. An end of the elastic member is disposed on the sliding member, and the elastic member can drive the sliding member to engage the clamping body with one of the plurality of positioning holes.

In the above support frame, the base body is capable of sliding along the groove of the second mounting member, the sliding member is slidably disposed on the base body. When the base body drives the first mounting member to move to a suitable position relative to the second mounting member, the elastic member drives the sliding member to move until the clamping body is engaged with one of the plurality of positioning holes. The adjusting member is then locked to the second mounting member to fix the first and second mounting members after adjusting a relative position between the first mounting member and the second mounting member. When the support frame is applied to a support structure, dimensions of an inside of the support structure providing support (support size) are adjusted by adjusting the relative position between the first mounting member and the second mounting member.

Some embodiments of the present disclosure are described in detail below with reference to the accompanying drawings. The features of the embodiments and examples described below can be combined with each other without conflict.

Figure 1:
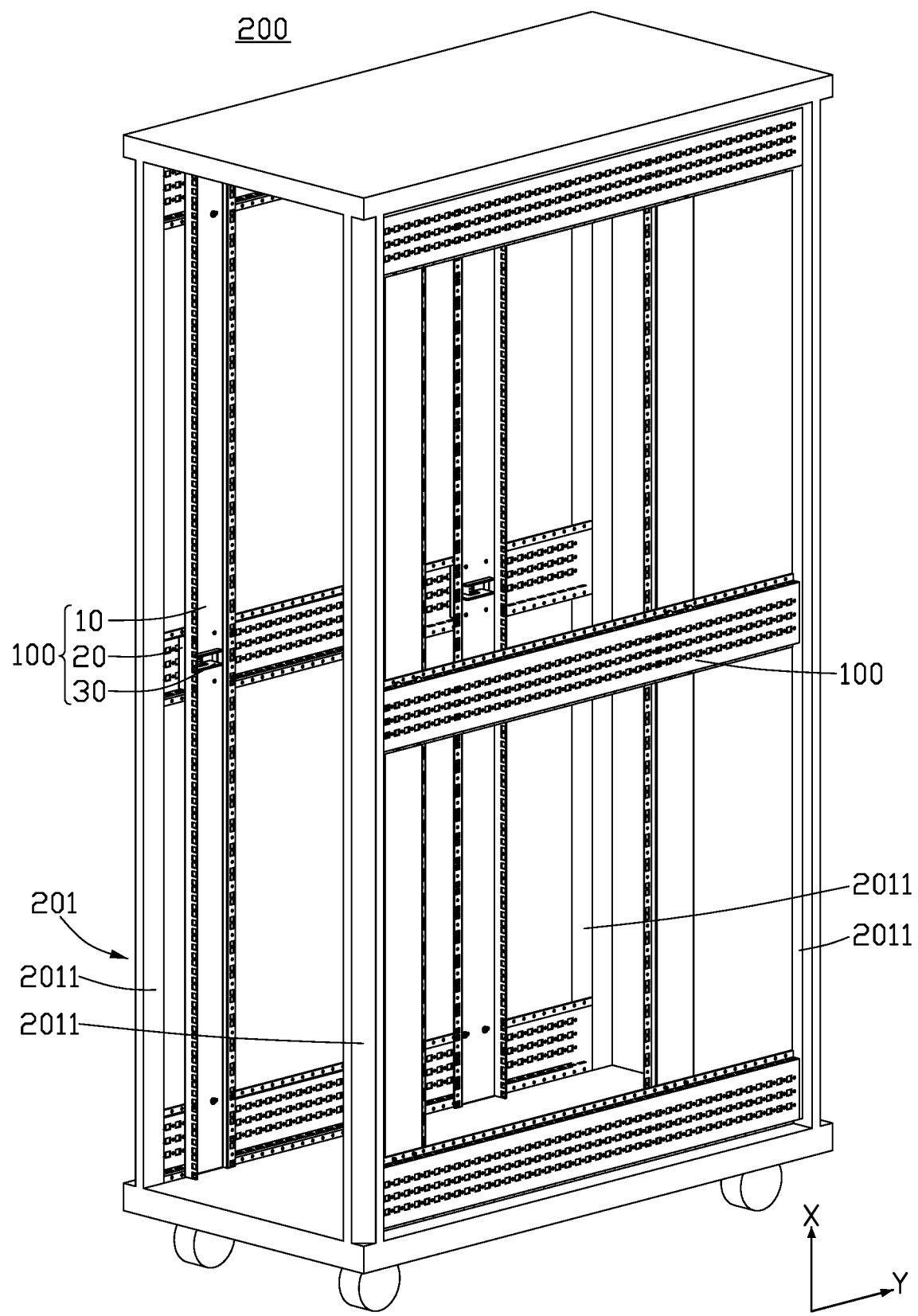
FIG. 1 is a perspective view of a cabinet according to an embodiment of the present disclosure.
Figure 2:
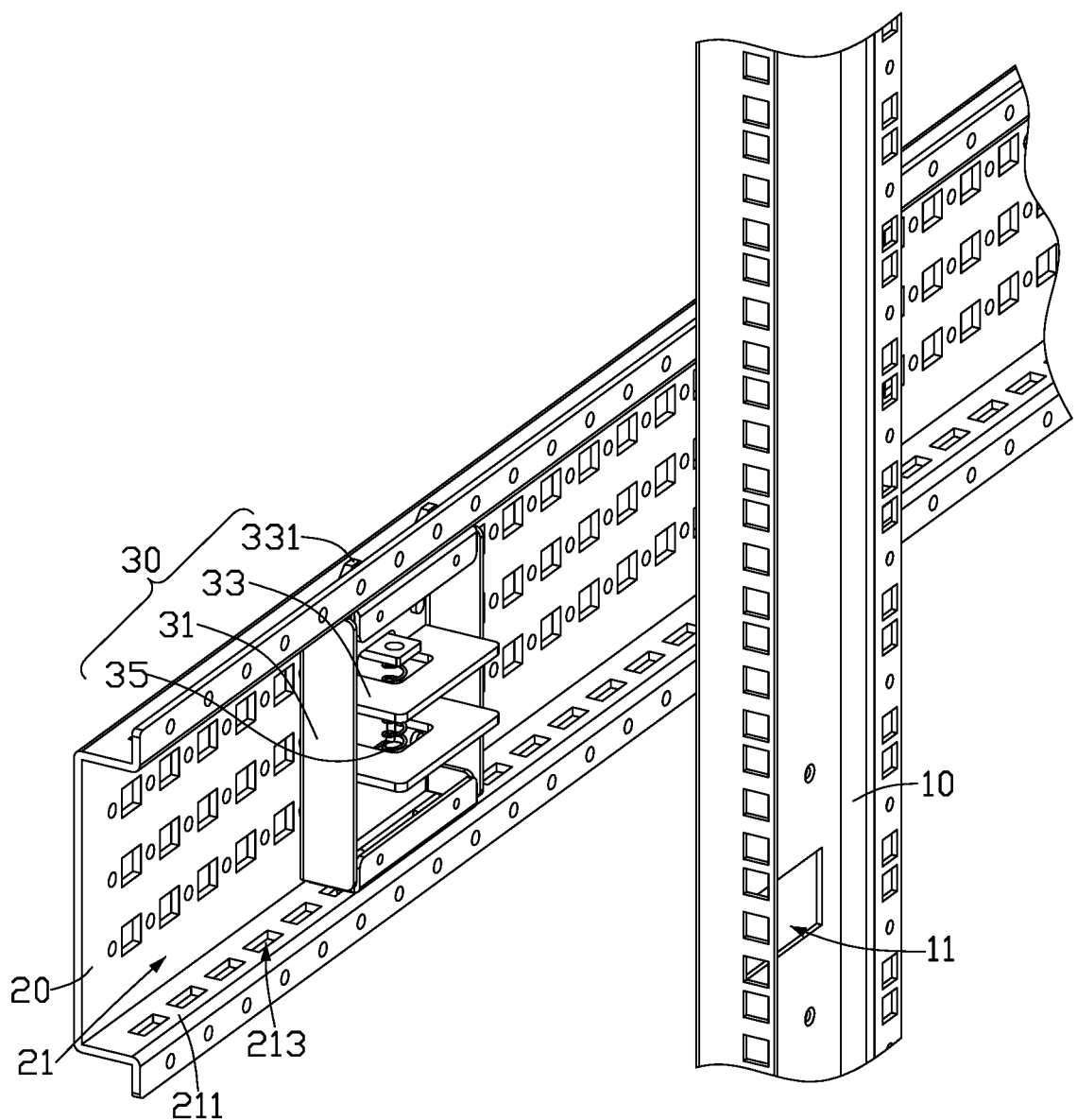
FIG. 2 is an exploded view of a local structure of a support frame of the cabinet of FIG. 1.
Figure 3:
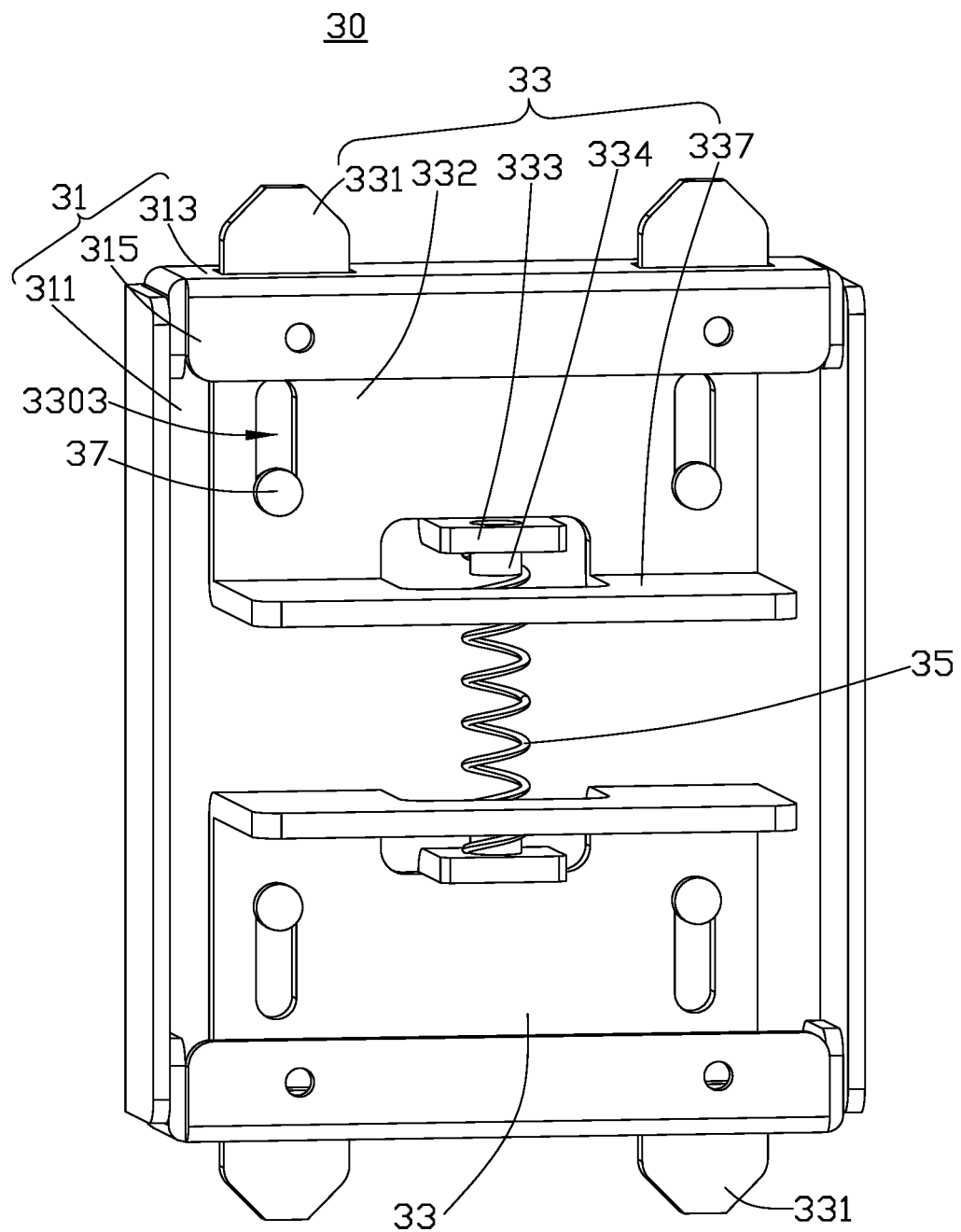
FIG. 3 is a perspective view of an adjusting member of the support frame of FIG. 2.

Referring to FIGS. 1 to 3, an embodiment of a support frame 100 is provided. The support frame 100 includes a first mounting member 10, a second mounting member 20, and an adjusting member 30. The first mounting member 10 extends along a first direction X. The second mounting member 20 extends along a second direction Y intersecting with the first direction X. The adjusting member 30 is disposed on the first mounting member 10. The adjusting member 30 can slide along the second mounting member 20 and can be locked to the second mounting member 20. The second mounting member 20 defines a groove 21 extending along the second direction Y. A groove wall 211 of the groove 21 defines a plurality of positioning holes 213. The adjusting member 30 can slide in the groove 21 and can be locked to the second mounting member 20. The first mounting member 10 is configured to support an installable article. For example, in one embodiment, the first mounting member 10 defines a hole, an article is provided with a connection structure matched with the hole, and the hole is connected with the connection structure to connect the first mounting member 10 and the article. In other embodiments, the first mounting member 10 abuts against the article to fix the article in place. The second mounting member 20 is mounted in a cabinet 200 of a data storage device and is configured to adjust an installation height, an installation width, and an installation depth of the cabinet 200. The adjusting member 30 includes a base body 31, a sliding member 33, and an elastic member 35. The base body 31 is disposed on the first mounting member 10 and is at least partially accommodated in the groove 21. The base body 31 can slide along the second direction Y in the groove 21. The sliding member 33 is slidably disposed on the base body 31. A clamping body 331 is disposed on the sliding member 33. An end of the elastic member 35 is disposed on the sliding member 33. In one embodiment, and without limitation, the elastic member 35 may be a compression spring. In other embodiments, the elastic member 35 may be a pneumatic telescopic structure. The elastic member 35 can drive the sliding member 33 to move until the clamping body 331 is engaged with one of the plurality of positioning holes 213.

A support size of an inside of the cabinet 200 is adjusted by adjusting a relative position between the first mounting member 10 and the second mounting member 20. When an external force is applied to the clamping body 331, the clamping body 331 is disengaged from the one of the plurality of positioning holes 213, and the sliding member 33 slides to a suitable position relative to the base body 31. When the external force is released, the elastic member 35 drives the sliding member 33 to slide until the clamping body 331 is engaged with another one of the plurality of positioning holes 213, and the adjusting member 30 is locked to the second mounting member 20 to fix the first mounting member 10 and the second mounting member 20.

In one embodiment, and without limitation, the first direction X may be perpendicular to the second direction Y. In other embodiments, an intersection angle between the first direction X and the second direction Y may be, but is not limited to, 30° or 70°. As long as the first mounting member 10 and the second mounting member 20 can move relative to each other, the support size of the inside the cabinet 200 can be made variable and adaptable.

The cabinet 200 includes a support body 201. The support body 201 includes a front wall, a rear wall, and two opposite side walls. An opening for the entry of the article is defined on the front wall. When it is necessary to change a support width of the inside of the cabinet 200, the support frame 100 is mounted on the rear wall corresponding to the opening, and the second direction Y is perpendicular to a connection direction in which the two side walls are connected. When it is necessary to change a height of the support size inside of the cabinet 200, the support frame 100 is mounted on the side walls, the front wall, or the rear wall, and the second direction Y is a vertical direction. When it is necessary to change a depth of the support size inside of the cabinet 200, the support frame 100 is mounted on one of the side walls, the first direction X is the vertical direction, and the second direction Y is parallel to a direction from the front wall to the rear wall.

In one embodiment, the cabinet 200 is a server cabinet, and the data storage device is a server. In other embodiments, the cabinet 200 may be a cabinet for storing hard disks. Without limitation, the support body 201 may include four columns 2011. In other embodiments, the support body 201 may also include side walls composed of a plate-shaped structures. The second mounting member 20 is disposed on a side wall of the support body 201 composed of two columns 2011. By moving the adjusting member 30 in the groove 21 of the second mounting member 20, the first mounting member 10 can be moved to a suitable position to meet the installation depth requirements of the cabinet 200. Then, the adjusting member 30 can be locked to the second mounting member 20 to fix the first mounting member 10 and the second mounting member 20, then the article (the server) to be supported is mounted on the support frame 100.

In other embodiments, the support frame 100 can also be applied to other structures to be supported. For example, the structure to be supported may be a bookshelf, and an installation mode of the support frame 100 in the structure to be supported is set according to the maximum size of books to be carried.

Figure 4:
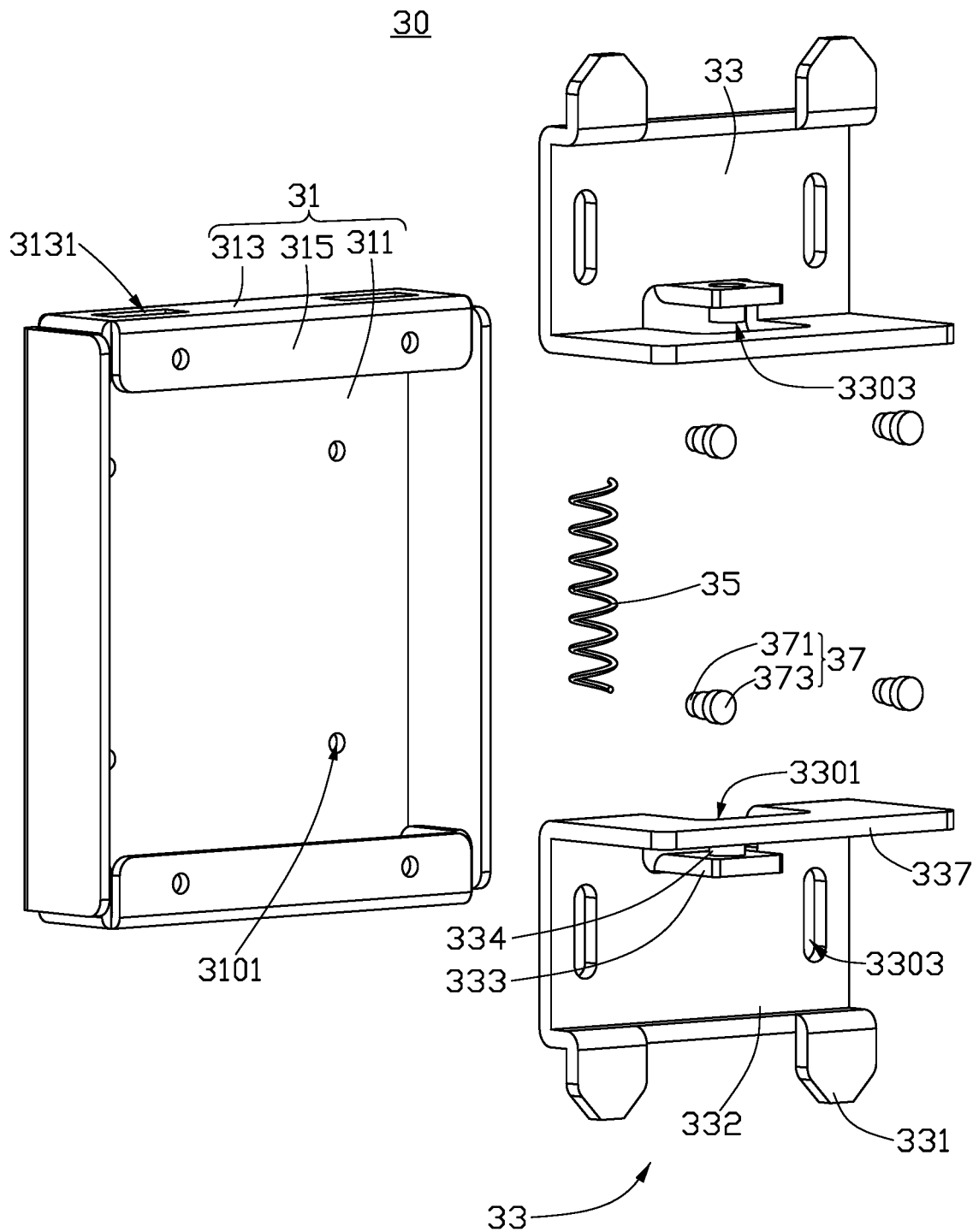
FIG. 4 is an exploded view of the adjusting member of FIG. 3.

Referring to FIGS. 3 and 4, in one embodiment, the number of the sliding members 33 is two. As shown in FIG. 2, each of opposite groove walls 211 of the groove 21 defines the plurality of positioning holes 213. Two ends of the elastic member 35 abut against the two sliding members 33 to drive the two sliding members 33 to move away from each other, so that the clamping bodies 331 of the two sliding members 33 are engaged with two positioning holes 213 on the two groove walls 211.

In one embodiment, the base body 31 includes a main body 311, two extending portion 313, and two mounting portions 315. The main body 311 is substantially plate shaped. The two extending portions 313 are disposed on opposite sides of the main body 311 and extend towards a side of the main body 311. In one embodiment, and without limitation, a vertical connection line between the two extending portions 313 may be parallel to the first direction X. Each of the mounting portion 315 is disposed on a side of one of the two extending portions 313 away from the main body 311. Each of the mounting portions 315 is connected with the first mounting member 10. Each of the extending portion 313 defines an avoidance hole 3131 for the clamping body 331 to pass through. In other embodiments, when the extending portions 313 do not block the movement of the sliding member 33, the avoidance hole 3131 can be omitted. For example, when the vertical line between the two extending portions 313 is parallel to the second direction Y, the two extending portions 313 do not block the movement of the sliding member 33. In other embodiments, there may be a single extending portion 313. In other embodiments, the two extending portions 313 may be disposed on two intersecting side walls of the main body 311.

The sliding member 33 includes a sliding portion 332, a resisting portion 333, and a positioning portion 334. The sliding portion 332 is slidably disposed on the base body 31. Specifically, the sliding portion 332 is slidably disposed on the main body 311. The clamping body 331 is disposed on the sliding portion 332. The resisting portion 333 is disposed on the sliding portion 332 and extends towards a side of the sliding portion 332. The positioning portion 334 is disposed on the resisting portion 333. The elastic member 35 is sleeved on the positioning portion 334 and an end of the elastic member 35 is stopped by the resisting portion 333. The arrangement of the positioning portion 334 and the resisting portion 333 allows a stable connection between the elastic member 35 and the sliding member 33.

In one embodiment, two sliding members 33 are slidably disposed on the base body 31 along the first direction X, and two positioning portions 334 of the two sliding members 33 are opposite to each other. Two ends of the elastic member 35 are sleeved on the two positioning portions 334 and can be stopped by two resisting portions 333, so that the elastic member 35 is located between the two resisting portions 333. The elastic member 35 drives the two resisting portions 333 away from each other, then the clamping bodies 331 of the two sliding members 33 are held in the positioning holes 213, so that the adjusting member 30 is locked to the second mounting member 20.

In one embodiment, the sliding member 33 is provided with a plurality of clamping bodies 331. The plurality of clamping bodies 331 are arranged at intervals along the second direction Y, thereby improving stability of the adjusting member 30 locked to the second mounting member 20.

The sliding member 33 also includes a pressing portion 337. The pressing portion 337 is disposed on the sliding portion 332 and extends towards a side of the sliding portion 332. The pressing portion 337 defines a first through hole 3301 which allows the elastic member 35 to pass through. The first mounting member 10 defines a second through hole 11 exposing the pressing portion 337. In one embodiment, the pressing portion 337 protrudes outside the first through hole 3301 for easy operation.

In other embodiments, the first through hole 3301 and the second through hole 11 can be omitted. The sliding member 33 can be driven to slide by pressing the resisting portion 333 or the clamping body 331 of the sliding member 33.

The arrangement of the pressing portion 337 simplifies the operation of the adjusting member 30. A hole in the wall of the first through hole 3301 can prevent the elastic member 35 from separating from the sliding member 33, thus the elastic member 35 is stably connected with the sliding member 33.

The adjusting member 30 also includes a connecting member 37. The base body 31 defines a connecting hole 3101. A connecting portion 371 matched with the connecting hole 3101 is disposed on an end of the connecting member 37, and a stopping portion 373 is disposed on the other end of the connecting member 37. The sliding member 33 defines a sliding groove 3303. The connecting portion 371 can pass through the sliding groove 3303 to be connected with the connecting hole 3101. The stopping portion 373 is located on a side of the sliding member 33 away from the base body 31 to stop the sliding member 33, so that the sliding member 33 is stably and slidably disposed on the base body 31. In one embodiment, the connecting member 37 is threaded with the connecting hole 3101. In other embodiments, the connecting member 37 is a snap-fit connection with the connecting hole 3101.

In other embodiments, there may be a single sliding member 33 of the support frame 100. Two ends of the elastic member 35 abut against the sliding member 33 and the base body 31. When the clamping body 331 of the single sliding member 33 is engaged with one positioning hole 213 on one groove wall 211, the adjusting member 30 is also locked to the second mounting member 20. In order to improve locking stability, a baffle (not shown) may be disposed on the second mounting member 20, the baffle is disposed on the groove wall 211 and extends along the first direction X. The baffle prevents the adjusting member 30 from leaving the groove 21 of the second mounting member 20.

The arrangement of the single sliding member 33 can also then realize adjusting of the relative position between the first mounting member 10 and the second mounting member 20 and fixing of the first mounting member 10 and the second mounting member 20, which simplifies a structure of the adjusting member 30 and reduces cost.

Referring to FIG. 1, in one embodiment, the number of the support frames 100 in the cabinet 200 may be two. Without limitation, the two support frames 100 may be disposed on opposite side walls of the cabinet 200. The two support frames 100 are disposed at positions of the cabinet 200 which are set according to the support size of the inside of the cabinet 200. There may be multiple support frames 100. The support frames 100 can be installed in the cabinet 200 in a variety of ways to adapt to changes in height, depth, and width.

In one embodiment, and without limitation, there may be only one second mounting member 20 in the support frame 100, and there may be two first mounting members 10 and two adjusting members 30 in the support frame 100. In other embodiments, the numbers of the first mounting members 10, the second mounting members 20, and the adjusting members 30 may all be one. In another embodiment, the number of the first mounting members 10 in the support frame 10 may be one, and the numbers of the second mounting members 20 and the adjusting members 30 may both be two. The numbers of the first mounting members 10, the second mounting members 20, and the adjusting members 30 can be set according to support strength required.

In the above support frame 100, the base body 31 can slide along the groove 21 of the second mounting member 20, the sliding member 33 is slidably disposed on the base body 31. When the base body 31 drives the first mounting member 10 to move to a suitable position relative to the second mounting member 20, the elastic member 35 drives the sliding member 33 to engage the clamping body 331 with one positioning hole 213 on the groove wall 211, then the adjusting member 30 is locked to the second mounting member 20 to fix the first mounting member 10 and the second mounting member 20 after adjusting a relative position between the first mounting member 10 and the second mounting member 20. When the support frame 100 is applied to the cabinet 200, the support size of the inside of the cabinet 200 is varied by adjusting the relative position between the first mounting member 10 and the second mounting member 20.

Furthermore, no tool is needed to adjust the support frame 100, the adjusting of the support frame 100 is simple and convenient. The support frame 100 has a simple structure and a low manufacturing cost and is easy to commercialize.

When the cabinet 200 is the server cabinet, the height, the depth, and the width of the inside of the cabinet 200 can be adjusted to meet installation requirements of various servers, thus the cabinet 200 is universal.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. A support frame comprising:
a first mounting member extending along a first direction;
a second mounting member extending along a second direction intersecting with the first direction, the second mounting member defining a groove extending along the second direction, a groove wall of the groove defining a plurality of positioning holes; and
an adjusting member comprising:
a base body disposed on the first mounting member, at least a part of the base body being accommodated in the groove;
at least one sliding member, the sliding member comprising a sliding portion slidably disposed on the base body, a resisting portion disposed on the sliding portion, a positioning portion disposed on the resisting portion, and a clamping body disposed on the sliding portion; and
an elastic member sleeved on the positioning portion, wherein one end of the elastic member is disposed on the sliding member, the elastic member is capable of driving the sliding member to engage the clamping body with one of the plurality of positioning holes, and the elastic member is stopped by the resisting portion.

2. The support frame of claim 1, wherein the adjusting member comprises two sliding members, each of opposite groove walls of the groove defines the plurality of positioning holes, two ends of the elastic member abut against the two sliding members respectively, the elastic member is capable of driving the two sliding members to move away from each other until the clamping body of each of the two sliding members is engaged with one of the plurality of positioning holes on one of the opposite groove walls.

3. The support frame of claim 1, wherein two ends of the elastic member abut against the sliding member and the base body respectively.

4. The support frame of claim 3, wherein the sliding member further comprises a pressing portion disposed on the sliding portion, the pressing portion defines a first through hole for the elastic member to extend through.

5. The support frame of claim 4, wherein the first mounting member defines a second through hole exposing the pressing portion.

6. The support frame of claim 1, wherein the adjusting member further comprises a connecting member, the base body defines a connecting hole, a connecting portion matched with the connecting hole is disposed on an end of the connecting member, a stopping portion is disposed on another end of the connecting member, the sliding member defines a sliding groove, the connecting portion extends through the sliding groove to connect with the connecting hole, the stopping portion is located on a side of the sliding member away from the base body, the connecting member is capable of sliding along the sliding groove.

7. The support frame of claim 1, wherein the sliding member comprises a plurality of clamping bodies which are arranged at intervals along the second direction.

8. A cabinet comprising:
a support body; and
a support frame, the support frame comprising:
  a first mounting member extending along a first direction;
  a second mounting member extending along a second direction intersecting with the first direction and disposed on the support body, the second mounting member defining a groove extending along the second direction, a groove wall of the groove defining a plurality of positioning holes; and
  an adjusting member comprising:
    a base body disposed on the first mounting member, at least a part of the base body being accommodated in the groove;
    at least one sliding member, the sliding member comprising a sliding portion slidably disposed on the base body, a resisting portion disposed on the sliding portion, a positioning portion disposed on the resisting portion, and a clamping body disposed on the sliding portion; and
    an elastic member sleeved on the positioning portion, wherein one end of the elastic member is disposed on the sliding member, the elastic member is capable of driving the sliding member to engage the clamping body with one of the plurality of positioning holes, and the elastic member is stopped by the resisting portion.

9. The cabinet of claim 8, wherein the adjusting member comprises two sliding members, each of opposite groove walls of the groove defines the plurality of positioning holes, two ends of the elastic member abut against the two sliding members respectively, the elastic member is capable of driving the two sliding members to move away from each other until the clamping body of each of the two sliding members is engaged with one of the plurality of positioning holes on one of the opposite groove walls.

10. The cabinet of claim 8, wherein two ends of the elastic member abut against the sliding member and the base body respectively.

11. The cabinet of claim 10, wherein the sliding member further comprises a pressing portion disposed on the sliding portion, the pressing portion defines a first through hole for the elastic member to extend through.

12. The cabinet of claim 11, wherein the first mounting member defines a second through hole exposing the pressing portion.

13. The cabinet of claim 8, wherein the adjusting member further comprises a connecting member, the base body defines a connecting hole, a connecting portion matched with the connecting hole is disposed on an end of the connecting member, a stopping portion is disposed on another end of the connecting member, the sliding member defines a sliding groove, the connecting portion extends through the sliding groove to connect with the connecting hole, the stopping portion is located on a side of the sliding member away from the base body, the connecting member is capable of sliding along the sliding groove.

14. The cabinet of claim 8, wherein the sliding member comprises a plurality of clamping bodies which are arranged at intervals along the second direction.

15. The cabinet of claim 8, wherein the cabinet is a server cabinet.

* * * * *